(12) United States Patent
Lee et al.

(10) Patent No.: US 7,688,612 B2
(45) Date of Patent: Mar. 30, 2010

(54) BIT LINE STRUCTURE FOR A MULTILEVEL, DUAL-SIDED NONVOLATILE MEMORY CELL ARRAY

(75) Inventors: Peter Wung Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 123 days.

(21) Appl. No.: 12/080,894

(22) Filed: Apr. 7, 2008

(65) Prior Publication Data

US 2008/0253186 A1    Oct. 16, 2008

Related U.S. Application Data

(60) Provisional application No. 60/923,418, filed on Apr. 13, 2007, provisional application No. 60/928,200, filed on May 8, 2007.

(51) Int. Cl.
*G11C 5/06* (2006.01)
*G11C 5/02* (2006.01)
*G11C 16/04* (2006.01)

(52) U.S. Cl. .............................. 365/63; 365/51; 365/72; 365/185.03; 365/185.17

(58) Field of Classification Search ..................... 365/63
See application file for complete search history.

(56) References Cited

U.S. PATENT DOCUMENTS

| | | | |
|---|---|---|---|
| 5,581,126 A * | 12/1996 | Moench ....................... 257/776 |
| 5,680,347 A * | 10/1997 | Takeuchi et al. ........ 365/185.17 |
| 5,768,192 A | 6/1998 | Eitan |
| 5,815,428 A * | 9/1998 | Tsuruda et al. ................ 365/63 |
| 5,864,181 A * | 1/1999 | Keeth .......................... 257/776 |
| 6,069,815 A * | 5/2000 | Mueller et al. ................ 365/63 |
| 6,255,166 B1 | 7/2001 | Ogura et al. |
| 6,515,906 B2 * | 2/2003 | Tedrow et al. .......... 365/185.21 |
| 6,657,880 B1 * | 12/2003 | Callahan ....................... 365/63 |
| 6,927,998 B2 * | 8/2005 | Takeuchi et al. ........ 365/185.02 |
| 7,113,431 B1 | 9/2006 | Hamilton et al. |
| 7,120,063 B1 | 10/2006 | Liu et al. |
| 7,139,194 B2 * | 11/2006 | Fukuoka ................. 365/185.05 |
| 7,151,293 B1 | 12/2006 | Shiraiwa et al. |

(Continued)

OTHER PUBLICATIONS

"Intel StrataFlash TM Memory Technology Overview," by Atwood et al., Intel Technology Journal Q4'97, pp. 1-8, 1997.

(Continued)

*Primary Examiner*—Son L Mai
(74) *Attorney, Agent, or Firm*—Saile Ackerman LLC; Stephen B. Ackerman; Billy Knowles (57) ABSTRACT

A nonvolatile memory array includes a plurality of dual-sided charge-trapping dual-sided charge-trapping nonvolatile memory cells arranged in rows and columns. The dual-sided charge-trapping dual-sided charge-trapping nonvolatile memory cells on each column form at least one grouping that is arranged in a NAND series string of dual-sided charge-trapping dual-sided charge-trapping nonvolatile memory cells. Each NAND series string has a top select transistor and a bottom select transistor. Pairs of braided bit lines are connected in a braided columnar bit line structure such that each column of the dual-sided charge-trapping dual-sided charge-trapping nonvolatile memory cells is connected to an associated pair of braided bit lines.

20 Claims, 9 Drawing Sheets

U.S. PATENT DOCUMENTS

| | | | |
|---|---|---|---|
| 7,158,411 | B2 | 1/2007 | Yeh et al. |
| 7,170,785 | B2 | 1/2007 | Yeh |
| 7,187,030 | B2 | 3/2007 | Chae et al. |
| 7,203,092 | B2 | 4/2007 | Nazarian |
| 7,257,011 | B2 * | 8/2007 | Miyakawa et al. ............ 365/69 |
| 7,414,909 | B2 * | 8/2008 | Okamoto et al. ......... 365/210.1 |
| 7,433,230 | B2 * | 10/2008 | Kono et al. ............ 365/185.11 |

OTHER PUBLICATIONS

"A Dual-Mode NAND Flash Memory: 1-Gb Multilevel and High-Performance 512-Mb Single-Level Modes," by Cho et al., IEEE Journal of Solid-State Circuits, vol. 36, No. 11, Nov. 2001, pp. 1700-1706.

Co-pending U.S. Appl. No. 60/903,731, filed Feb. 26, 2007, "Circuits and Algorithms for Simultaneous Programming and Reading, Multiple-Level, Dual-Sided Cell in NAND, NOR, EEPROM and Combo Flash Arrays," assigned the the same assingee as the present invention.

Co-pending U.S. Appl. No. 12/069,637, filed Feb. 12, 2008, "A Circuit and Method for Multiple-Level Programming, Reading and Erasing Dual-Sided Nonvolatile Memory Cell," assigned to the same assignee as the present invention.

Co-pending U.S. Appl. No. 60/904,294, filed Feb. 28, 2007, "Circuits and Algorithms for Simultaneous Programming and Reading the Single-Poly, Multiple-Level, Dual-Sided Cell in NAND, NOR, EEPROM and Combo Flash Arrays," assigned to the same assignee as the present invention.

Co-pending U.S. Appl. No. 12/069,228, filed Feb. 8, 2008, "A Bit Line Structure for a Multilevel, Dual-Sided Nonvolatile Memory Cell Array," assigned to the same assignee as the present invention.

Co-pending U.S. Appl. No. 12/075,677, filed Mar. 13, 2008, "A Bit Line Gate Transistor Structure for a Multilevel, Dual-Sided Nonvolatile Memory Cell NAND Flash Array," assigned to the same assignee as the present invention.

* cited by examiner

BIT LINE STRUCTURE FOR A MULTILEVEL, DUAL-SIDED NONVOLATILE MEMORY CELL ARRAY

This application claims priority under 35 U.S.C. §119 to U.S. Provisional Patent Application Ser. No. 60/923,418, filed on Apr. 13, 2007, which is herein incorporated by reference in its entirety.

This application claims priority under 35 U.S.C. §119 to U.S. Provisional Patent Application Ser. No. 60/928,200, filed on May 8, 2007, which is herein incorporated by reference in its entirety.

RELATED PATENT APPLICATIONS

U.S. Provisional Patent Application Ser. No. 60/903,731, filed on Feb. 26, 2007, which is herein incorporated by reference in its entirety.

U.S. Provisional Patent Application Ser. No. 60/904,294, filed on Feb. 28, 2007, which is herein incorporated by reference in its entirety.

U.S. patent application Ser. No. 12/069,228 filed on Feb. 8, 2008, assigned to the same assignee as the present invention, and incorporated herein by reference in its entirety.

U.S. patent application Ser. No. 12/069,637 filed on Feb. 12, 2008, assigned to the same assignee as the present invention, and incorporated herein by reference in its entirety.

U.S. patent application Ser. No. 12/075,677 filed on Mar. 13, 2008, assigned to the same assignee as the present invention, and incorporated herein by reference in its entirety.

BACKGROUND OF THE INVENTION

1. Field of the Invention

This invention relates generally to nonvolatile memory array structure and operation. More particularly, this invention relates to bit line structures of dual-sided charge-trapping nonvolatile memory cells. Even more particularly, this invention relates to a braided bit line structures of multilevel dual-sided charge-trapping nonvolatile memory cell array for programming, reading, and erasing trapped charges representing multiple digital data bits within a charge trapping region of the dual-sided charge-trapping nonvolatile memory cells.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular type of Nonvolatile Memory. Flash Memory has the combined advantages of the high density, small silicon area, low cost and can be repeatedly programmed and erased with a single low-voltage power supply voltage source.

The Flash Memory structures known in the art employ a charge storage mechanism and a charge trapping mechanism. The charge storage regime, as with a floating gate nonvolatile memory, the charge representing digital data is stored on a floating gate of the device. The stored charge modifies the threshold voltage of the floating gate memory cell determine that digital data stored. In a charge trapping regime, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$). The trapping structure of the charge trapping layer is such that it is possible to store two bits of data in a single SONOS/MONOS nonvolatile memory cell.

U.S. Pat. No. 5,768,192 (Eitan) illustrates a charge trapping non-volatile semiconductor memory cell utilizing asymmetrical charge trapping. The programmable read only memory (PROM) has a trapping dielectric sandwiched between two silicon dioxide layers The trapping dielectric is silicon oxide-silicon nitride-silicon oxide (ONO) and silicon dioxide with buried polysilicon islands. A nonconducting dielectric layer functions as an electrical charge trapping medium. This charge trapping layer is sandwiched between two layers of silicon dioxide acting as an electrical insulator. A conducting control gate layer is placed over the upper silicon dioxide layer. The memory device is programmed using hot electron programming, by applying programming voltages to the gate and the drain while the source is grounded. Hot electrons are accelerated sufficiently to be injected into the region of the trapping dielectric layer near the drain. The device is read in the opposite direction from which it was written. The reading voltages are applied to the gate and the source while the drain is grounded. For the same applied gate voltage, reading in the reverse direction greatly reduces the potential across the trapped charge region. This permits much shorter programming times by amplifying the effect of the charge trapped in the localized trapping region.

U.S. Pat. No. 7,187,030 (Chae, et al.) describes a SONOS memory device, and a method for erasing data from the SONOS memory device. The erasing includes injecting charge carriers of a second sign into a trapping film, which has trapped charge carriers of a first sign to store data in the trapping film. The charge carriers of the second sign are generated by an electric field formed between one of a first and second electrodes contacting at least one bit line and a gate electrode contacting a word line. A blocking film may be provided between the gate electrode and the trapping film. The charge carriers of the second sign may be hot holes.

U.S. Pat. No. 7,170,785 (Yeh) illustrates a method and apparatus for operating a string of charge trapping memory cells. The string of memory cells with a charge trapping structure is read, by selecting part of a memory cell selected by a word line. Part of the memory cell is selected by turning on one of the pass transistors on either side of the string of memory cells. The charge storage state of the selected part is determined by measuring current in a bit line tied to both pass transistors.

U.S. Pat. No. 7,158,411 (Yeh, et al.) provides a memory architecture for an integrated circuit that includes a first memory array configured to store data for one pattern of data usage and a second memory array configured to store data for another pattern of data usage. The first and second memory arrays are formed of charge storage based nonvolatile memory cells.

U.S. Pat. No. 7,151,293 (Shiraiwa, et al.) describes SONOS memory with inversion bit-lines. The SONOS memory cell, formed within a semiconductor substrate, includes a bottom dielectric disposed on the semiconductor substrate, a charge trapping material disposed on the bottom dielectric, and a top dielectric disposed on the charge trapping material. Furthermore, the SONOS memory cell includes a word-line gate structure disposed on the top dielectric and at least one bit-line gate for inducing at least one inversion bit-line within the semiconductor substrate.

U.S. Pat. No. 7,139,194 (Fukuoka) provides a nonvolatile semiconductor memory where each nonvolatile memory cell transistor has directivities that a current flows only from the drain to the source and that charge is exchangeable only at the source. The source of one of a pair of memory cell transistors connected to each word line is connected to the drain of the other memory cell transistor, and the drain of the one memory cell transistor is connected to the source of the other. During a data rewrite operation, reverse voltages are applied to the sources and drains of the pair of memory cell transistors. Because of the directivities of each memory cell transistor, charge is exchanged with a charge accumulation layer only in the source region. This makes the data rewritable in only one of the pair of memory cell transistors. As a result, data is rewritable on a memory cell basis without increasing the memory cell size.

U.S. Pat. No. 7,120,063 (Liu, et al.) illustrates flash memory cells that include a dielectric material formed above a substrate channel region, a charge trapping material formed over the dielectric material, and a control gate formed over the charge trapping material. The cell may be programmed by directing electrons from the control gate into the charge trapping material to raise the cell threshold voltage. The electrons may be directed from the control gate to the charge trapping material by coupling a substrate to a substrate voltage potential, and coupling the control gate to a gate voltage potential, where the gate voltage potential is lower than the substrate voltage potential. The cell may be erased by directing electrons from the charge trapping material into the control gate to lower a threshold voltage of the flash memory cell, such as by coupling the substrate to a substrate voltage potential, and coupling the control gate to a gate voltage potential, where the gate voltage potential is higher than the substrate voltage potential.

The nonvolatile memory cells of the prior art are often configured as NAND cell structures. U.S. Pat. No. 6,614,070 and U.S. Pat. No. 6,163,048 (Hirose, et al.) describe a semiconductor nonvolatile memory device having a NAND cell structure. A NAND stack or NAND series string of nonvolatile memory cell transistors is placed within a well formed on a semiconductor substrate. The series nonvolatile memory cell transistors have threshold voltages that are electrically altered over a range of depletion values. When a cell within a certain NAND stack is selected for a read operation, a peripheral circuit drives selected gate word line to the well potential and drives the word lines of the other gates within the selected NAND stack to a potential at least equal in magnitude to the magnitude of the a reference voltage plus the threshold voltage of a memory cell in the programmed state.

"A 146-mm$^2$ 8-Gb Multi-Level NAND Flash Memory with 70-nm CMOS Technology", Hara, et al., IEEE Journal of Solid-State Circuits, January 2006, Vol.: 41, Issue: 1, pp.: 161-169 provides an 8-Gb multi-level NAND Flash memory with 4-level programmed cells.

"NROM: A Novel Localized Trapping, 2-Bit Nonvolatile Memory Cell", Eitan, et al., IEEE Electron Device Letters, November, 2000, Vol.: 21, Issue: 11, pp.: 543-545, presents a novel flash memory cell based on localized charge trapping in a dielectric layer. It is based on the storage of a nominal ~400 electrons above a n+/p junction. Programming is performed by channel hot electron injection and erase by tunneling enhanced hot hole injection. The read methodology is sensitive to the location of trapped charge above the source. This single device cell has a two physical bit storage capability.

"A Dual-Mode NAND Flash Memory: 1-Gb Multilevel and High-Performance 512-Mb Single-Level Modes", Cho et al. IEEE Journal of Solid-State Circuits, November, 2001, Vol.: 36, Issue: 11, pp.: 1700-1706, describes a 1.16.7-mm$^2$ NAND flash memory having two modes: a 1-Gb multilevel program mode (MLC) and a high-performance 512-Mb single-level program cell (SLC) modes. A two-step bit line setup scheme suppresses the peak current below 60 mA. A word line ramping technique avoids program disturbance. The SLC mode uses the 0.5-V incremental step pulse and self-boosting program inhibit scheme to achieve high program performance, and the MLC mode uses 0.15-V incremental step pulse and local self-boosting program inhibit scheme to tightly control the cell threshold voltage Vth distributions.

U.S. Pat. No. 7,203,092 (Nazarian) provides a memory array having rows and columns of flash memory cells. Each column of the memory cells is arranged as NAND series strings of memory cells. Each NAND series string having a top select transistor and a bottom select transistor. The top select transistor and the bottom select transistor are coupled to bit lines, such that alternate bit lines are operated either as source lines or bit lines in response to bit line selection and biasing.

The structure of a multiple bit programming of nonvolatile memory cells is known in the art as described in "Intel StrataFlash™ Memory Technology Overview", Atwood, et al., Intel Technology Journal, Vol. 1, Issue 2, Q4 1997, found www.intel.com, Apr. 23, 2007. The nonvolatile memory cells include a single transistor with an isolated floating gate. The flash cell is an analog storage device in that it stores charge (quantized at a single electron) not bits. By using a controlled programming technique, it is possible to place a precise amount of charge on the floating gate. The charge can be accurately placed to one of four charge states (or ranges) that describe two bits. Each of the four charge states is associated with a two-bit data pattern. The number of states required is equal to 2N where N is the desired number of bits. Threshold of the flash cells is then determined to read the digital data stored in the flash cell.

U.S. Pat. No. 7,113,431 (Hamilton, et al.) pertains to a technique for erasing bits in a dual bit memory in a manner that maintains complementary bit disturb control of bit-pairs of memory cells wherein each bit of the dual bit memory cell can be programmed to multiple levels. One exemplary method comprises providing a word of memory cells after an initial erasure and programming of the bits of the word to one or more of the higher program levels. A disturb level is determined for each of the bit-pairs of the word. A combined disturb level is then computed that is representative of the individual disturb levels. A pattern of drain voltages is then applied to the word for a number of program passes until a target pattern is stored in the word of memory cells based on the combined disturb level and the unprogrammed bit of the bit-pairs is erased to a single program level. This compensates for the disturbance level that exists between the complementary bit-pairs of the word, improves the threshold voltage (Vt) distribution at the program level of the erased state and thereby improves the accuracy of subsequent higher level programming operations and mitigates false or erroneous reads of the states of such program levels.

U.S. Pat. No. 7,139,194 (Fukuoka) provides a nonvolatile memory cell transistor that has current flow only from the drain to the source of the memory cell and that charge is exchangeable only at the source. The first and second bit lines of a pair of bit lines are wired in a twisted pair form in the direction perpendicular to the word lines.

U.S. Pat. No. 6,255,166 (Ogura, et al.) describes a high speed and low program voltage split gate nonvolatile memory cell. The nonvolatile memory cell includes a first gate insulator formed on a surface of a first channel forming semiconductor region adjacent to a source region. A second gate insulator is formed on a surface of a second channel forming semiconductor region adjacent to a drain region. A first gate electrode formed on the first gate insulator and a second gate electrode formed on the second gate insulator. The second gate insulator includes a first layer forming a potential barrier at the interface with the second channel forming region. A third layer forms a potential barrier at the interface with the second gate electrode and the second layer between the first and third layers forms a carrier trapping level.

SUMMARY OF THE INVENTION

An object of this invention is to provide a cross connective braided columnar paired bit line structure for an array of multilevel programmed dual-sided nonvolatile memory cells.

To accomplish this object, a nonvolatile memory array of dual-sided charge-trapping nonvolatile memory cells is arranged in rows and columns. The dual-sided charge-trapping nonvolatile memory cells on each column form at least one grouping of dual-sided charge-trapping nonvolatile memory cells that is arranged in a NAND series string of dual-sided charge-trapping nonvolatile memory cells. Each NAND series string has a top select transistor and a bottom select transistor connected to the NAND series string of dual-sided charge-trapping nonvolatile memory cells. The dual-sided charge-trapping nonvolatile memory cells are single poly-silicon SONOS nonvolatile memory cells, MONOS nonvolatile memory cells, or split-gate nonvolatile memory cells.

A plurality of braided bit lines is connected such that each column of the dual-sided charge-trapping nonvolatile memory cells is associated with a pair of bit lines such that a source/drain of the top select transistor is connected through a first conductive segment to a first bit line of the pair of bit lines and a source/drain of the bottom select transistor is connected through a second conductive segment to a second bit line of the pair of bit lines. The pair of braided bit lines associated with each column of dual-sided charge-trapping nonvolatile memory cells is connected within the array to allow the first bit line to be connected to the top select transistor and the second bit line to be connected to the bottom select transistor.

The first and second conductive segments are placed on a first level conductive layer disposed on an isolating layer superiorly to the dual-sided charge-trapping nonvolatile memory cells of the NAND string having the top select transistor and the bottom select transistor connected to the first and second conductive segments. The first bit line of the pair of associated braided bit lines is connected to the first conductive segment and is placed in a wiring channel at a first side of the each column of the dual-sided charge-trapping nonvolatile memory cells and the second bit line of the pair of associated braided bit lines is connected to the second conductive segment and is placed in a wiring channel at a second side of the each column of the dual-sided charge-trapping nonvolatile memory cells.

The nonvolatile memory array further includes a plurality of word lines where each word line is associated with one row of the plurality of dual-sided charge-trapping nonvolatile memory cells. A top select line is connected to a gate of the top select transistor of each column of the dual-sided charge-trapping nonvolatile memory cells. A bottom select line is connected to a gate of the bottom select transistor of each column of the dual-sided charge-trapping nonvolatile memory cells. A word line controller is connected to the word lines, the top select line, and the bottom select line to transfer word line operational voltages for selecting, programming, reading, and erasing the trapped charges representing the multiple digital data bits within the charge trapping region of each of the selected dual-sided charge-trapping dual-sided charge-trapping nonvolatile memory cells.

The nonvolatile memory array further includes a bit line controller that is connected to each pair of the plurality of braided bit lines to transfer bit line operational voltages to selected dual-sided charge-trapping nonvolatile memory cells of the NAND series string of dual-sided charge-trapping nonvolatile memory cells for programming, reading, and erasing trapped charges representing digital data bits within a charge trapping region of each of the selected dual-sided charge-trapping nonvolatile memory cells.

The dual-sided charge-trapping nonvolatile memory cells are single poly-silicon SONOS nonvolatile memory cells, MONOS nonvolatile memory cells, or split-gate nonvolatile memory cells.

BRIEF DESCRIPTION OF THE DRAWINGS

FIGS. 4b-c are cross-sectional views of the second embodiment of an array of an NAND series strings of dual-sided charge-trapping nonvolatile memory cells with pairs of associated braided bit lines of this invention as shown in FIG. 6a.

DETAILED DESCRIPTION OF THE INVENTION

A nonvolatile memory array of this invention is formed of dual-sided charge-trapping nonvolatile memory cells that are arranged in rows and columns. Groupings of dual-sided charge-trapping nonvolatile memory cells on each column are arranged in a NAND series strings. Each NAND series string has a top select transistor and a bottom select transistor connected in series with each of the groupings of the dual-sided charge-trapping nonvolatile memory cells. Each column of the dual-sided charge-trapping nonvolatile memory cells is associated with a pair of braided bit lines. A source/drain of the top select transistor is connected through a first conductive segment to a first of the associated pair of braided bit lines and a source/drain of the bottom select transistor is connected through a second conductive segment to a second of the associated pair of braided bit lines.

The first and second conductive segments are placed on a first level conductive layer disposed on an isolating layer superiorly to the dual-sided charge-trapping nonvolatile memory cells of the NAND string having the top select transistor and the bottom select transistor connected to the first and second conductive segments. The first bit line of the pair of associated braided bit lines is connected to the first conductive segment and is placed in a wiring channel at a first side of the each column of the dual-sided charge-trapping nonvolatile memory cells and the second bit line of the pair of associated braided bit lines is connected to the second conductive segment and is placed in a wiring channel at a second side of the each column of the dual-sided charge-trapping nonvolatile memory cells.

Figure 1A:
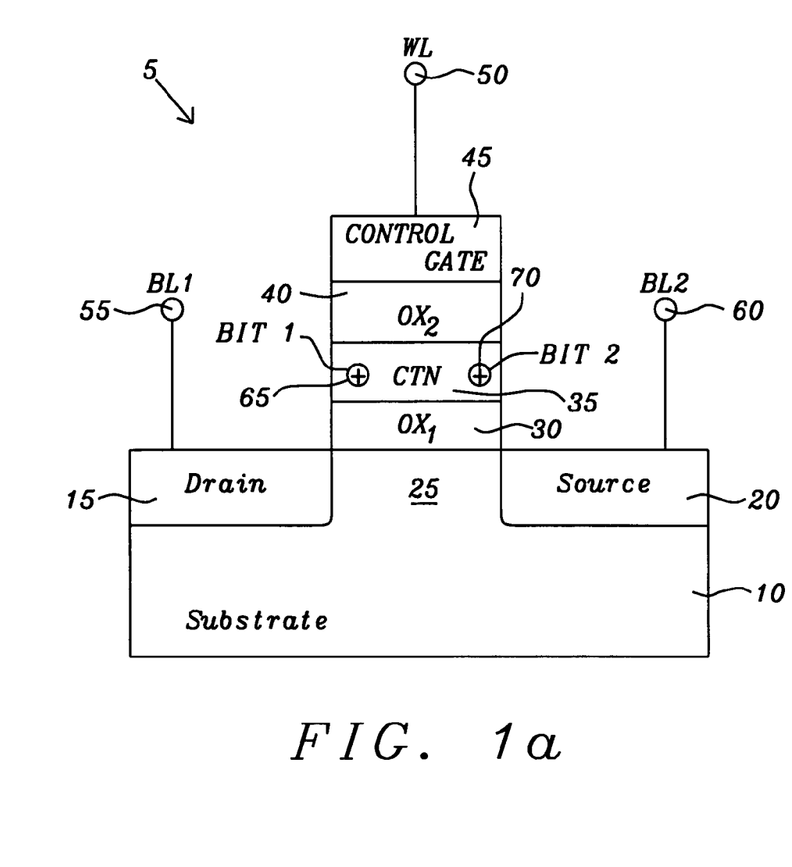
FIGS. 1a and 1b are respectively a cross sectional view of and a schematic symbol for a dual-sided charge-trapping nonvolatile memory cell.
Figure 1B:
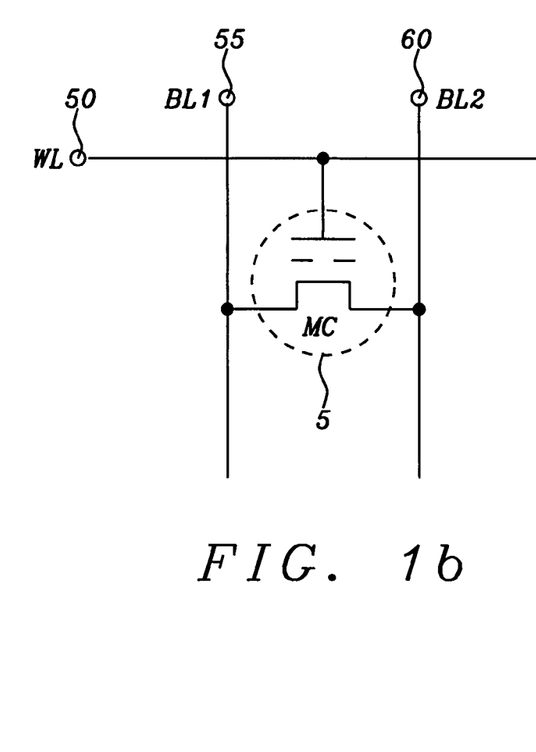

Refer now to FIGS. 1a and 1b for a discussion Silicon-Oxide-Nitride-Oxide-Silicon (SONOS) or Metal-Oxide-Nitride-Oxide-Silicon (MONOS) dual-sided flash memory cell structure in FIG. 1a and the schematic symbol in FIG. 1b for the nonvolatile memory array of this invention. The dual-sided charge-trapping nonvolatile memory cell 5 is formed within a substrate 10. A drain region 15 and source region 20 are formed within the substrate 10. A relatively thin gate oxide or tunneling oxide 30 is deposited on the substrate 10. A charge trapping layer 35 is then formed over the oxide layer 30 above the channel region 25 between drain region 15 and source region 20. A second dielectric oxide layer 40 is placed on top of charge trapping layer 35 to separate the charge trapping layer 35 from a poly-crystalline silicon layer 45. The poly-crystalline silicon layer 45 forms the control gate of the dual-sided charge-trapping nonvolatile memory cell 5. The control gate 45 of the dual-sided charge-trapping nonvolatile memory cell 5, when placed in an array of dual-sided charge-trapping nonvolatile memory cells 5, is connected to a word line terminal 50. The drain 15 is connected to a first bit line terminal 55 and the source 20 is connected to a second bit line terminal 55. The dual-sided flash memory cell stores the digital data bits as trapped charge within the charge trapping layer 35 above the channel 25 that is formed between drain 15 and source 20.

The operation of the multilevel dual-sided flash memory cell 5 consists of an erase operation, a program operation, and a read operation. In the erase operation, the word line terminal 50 is set to a very large erasing voltage that is applied to the control gate 45 to inject the electrons into the trapped charges 65 and 70 from the channel region between drain region 15 and source region 20. The first and second bit line terminals 55 and 60 and thus the drain 15 and source 20 are set to ground reference level. The program operation of the multilevel dual-sided flash memory cell 5 begins by setting the word line terminal 50 to a medium large programming voltage that is applied to the control gate 45. The medium large programming voltage has an opposite polarity of the very large erasing voltage. For programming the charge trapping region 65 nearest the drain region 15, the first bit line terminal 55 and thus the drain 15 is set to the bit line voltage level and the second bit line terminal 60 and thus the source 20 is set to the ground reference voltage. For programming the charge trapping region 70 nearest the source region 20, the second bit line terminal 60 and thus the source 20 is set to the bit line voltage level and the first bit line terminal 55 and thus the drain 15 is set to the ground reference voltage. The read operation begins by setting the word line terminal 50 and thus the control gate 45 to a read voltage level. To read the program state of the charge trapping region 65, the first bit line terminal 55 and thus the drain region 15 is set to the ground reference voltage and the second bit line terminal 60 and thus the source region 20 is set to the drain read voltage level. The threshold voltage (Vt) as adjusted by the charge level of the charge trapping region 65 determines the digital data stored in the charge trapping region 65. To read the program state of the charge trapping region 70, the first bit line terminal 55 and thus the drain region 15 is set to the drain read voltage level and the second bit line terminal 60 and thus the source region 20 is set to the ground reference voltage. The threshold voltage (Vt) as adjusted by the charge level of the charge trapping region 70 determines the digital data stored in the charge trapping region 70.

Figure 1C:
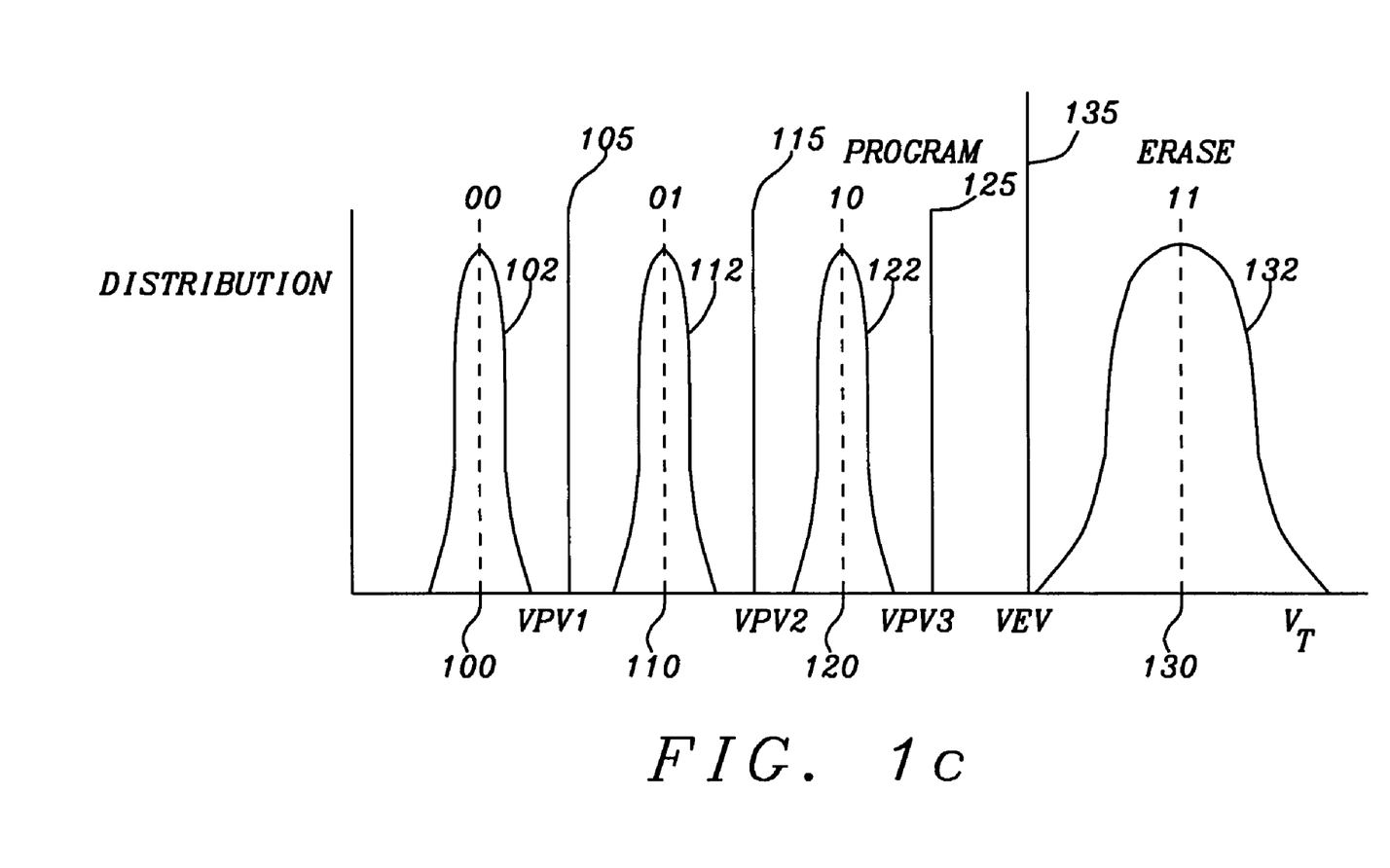
FIG. 1c is a plot of the threshold voltage (Vt) for programming each memory cell of an array of dual-sided charge-trapping nonvolatile memory cells versus the number of dual-sided charge-trapping nonvolatile memory cells having a specific threshold voltage for a multiple bit programming by a programming circuit of the control apparatus of this invention.

The method of operation of this invention for a SONOS/MONOS dual-sided flash memory cell provides multiple bits being stored in each of the charge trapping regions 65 and 70 of FIG. 1a. In FIG. 1c, each of the charge trapping regions may have one of four levels 100, 110, 120, and 130 and thus represent two binary bits of the digital data. The threshold voltage level 130 being the erased voltage level as well as the voltage level for the digital data for a digital 11. An array of the SONOS/MONOS dual-sided flash memory cells will be programmed sufficiently long such that the distribution of the threshold voltages (Vt) 102, 112, 122, and 132 allow the setting of the word line voltage and thus the control gates of the array to the program voltages VPV1 105, VPV2 115, and VPV3 125. During a read operation the control gate is set at each voltage level to determine the threshold voltage Vt representing the two bits of the digital data stored in each of the charge trapping layers.

Figure 2:
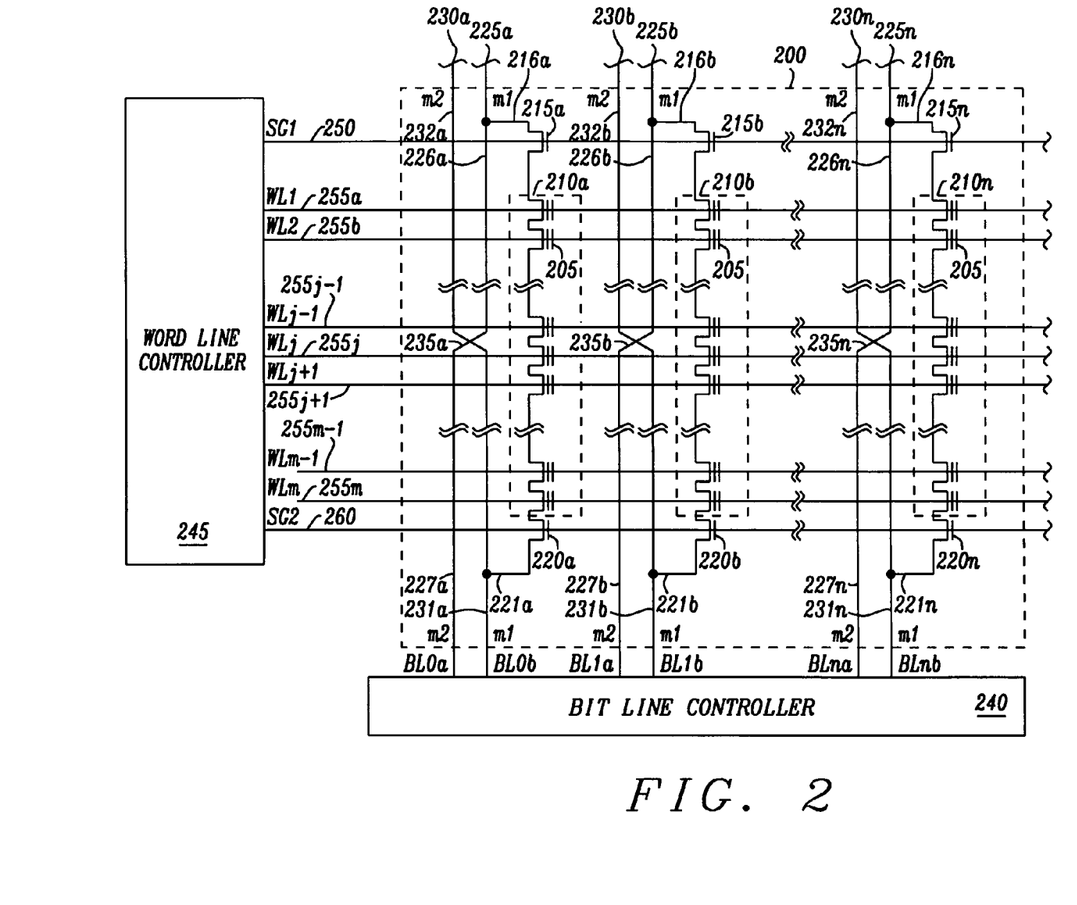
FIG. 2 is a schematic diagram of an embodiment of an array of NAND series strings of dual-sided charge-trapping nonvolatile memory cells with a pair of associated braided bit lines of this invention.

The nonvolatile memory array 200 of this embodiment is formed of dual-sided charge-trapping nonvolatile memory cells of FIG. 1a that are arranged in rows and columns, as illustrated in FIG. 2. Groupings 210a, 210b, . . . 210n, of the dual-sided charge-trapping nonvolatile memory cells 205 resident on each column of the nonvolatile memory array 200 of this embodiment are connected to form NAND series strings or NAND stacks of the dual-sided charge-trapping nonvolatile memory cells 205. Each of the NAND series string groupings 210a, 210b, . . . 210n have a top select transistor 215a, 215b, . . . 215n and a bottom select transistor 220a, 220b, . . . 220n. Each top select transistor 215a, 215b, . . . 215n has a first source/drain connected to the drain of the top dual-sided charge-trapping nonvolatile memory cell 205 of each of the NAND series string groupings 210a, 210b, . . . 210n-1. Each bottom select transistor 220a, 220b, . . . 220n has a first source/drain connected to the source of the bottom dual-sided charge-trapping nonvolatile memory cell 205 of each of the NAND series string groupings 210a, 210b, . . . 210n. The sources and drains of the top select transistors 215a, 215b, . . . 215n and the bottom select transistor 220a, 220b, . . . 220n are interchangeable in function and therefore are designated first and second source/drains for clarity.

Each column (in this embodiment, one of the NAND series string groupings 210a, 210b, . . . 210n) of the nonvolatile memory array 200 is associated with a pair of braided bit lines 225a, 225b, . . . , 225n and 230a, 230b, . . . 230n. A first of the associated pair of braided bit lines 225a, 225b, . . . , 225n is connected to a second source/drain of the top select transistor 215a, 215b, . . . 215n of the respective column of NAND series string groupings 210a, 210b, . . . 210n of dual-sided charge-trapping nonvolatile memory cells 205 and the second of the associated pair of braided bit lines 230a, 230b, . . . , 230n is further connected to a second source/drain of the bottom select transistor 220a, 220b, . . . 220n of a respective column of NAND series string groupings 210a, 210b, . . . 210n of the dual-sided charge-trapping nonvolatile memory cells 205. A contact structure 216a, 216b, ... 216n connects the second source/drain of each the top select transistors 215a, 215b, ... 215n to the first level metal layer 226a, 226b, ... 226n of each of the bit lines 225a, 225b, ..., 225n. Similarly, a contact structure 221a, 221b, ... 221n connects the second source/drain of each the bottom select transistors 220a, 220b, ... 220n to the first level metal layer 226a, 226b, ..., 226n of each of the second associated braided bit lines 230a, 230b, ..., 230n. A cross-over interlayer connection 235a, 235b, ..., 235n allows the first level metal layer 226a, 226b, ..., 226n of the first bit lines 225a, 225b, ..., 225n to be routed to the second metal layers 227a, 227b, ..., 227n and allows the first level metal layer 231a, 231b, ..., 231n of the second bit lines 230a, 230b, ..., 230n to be routed to the second metal layers 232a, 232b, ..., 232n. This routing of the pairs of braided bit lines 225a, 225b, ..., 225n and 230a, 230b, ..., 230n permits the placement of the pairs of braided bit lines 225a, 225b, ..., 225n and 230a, 230b, ..., 230n in channels between each of the columns of NAND series string groupings 210a, 210b, ... 210n of the dual-sided charge-trapping nonvolatile memory cells 205. This routing of the pairs of the bit lines 225a, 225b, ..., 225n and 230a, 230b, ..., 230n further creates a braided structure for the pairs of braided bit lines 225a, 225b, ..., 225n and 230a, 230b, ..., 230n.

All of the pairs of braided bit lines 225a, 225b, ..., 225n and 230a, 230b, ..., 230n are connected to the bit line controller 240. The bit line controller 240 provides the necessary bit line operational voltages to selected dual-sided charge-trapping nonvolatile memory cells 205 for programming, reading, and erasing trapped charges representing multiple digital data bits within a charge trapping region of each of the selected dual-sided charge-trapping nonvolatile memory cells 205.

A control gate of each of the dual-sided charge-trapping nonvolatile memory cells 205 on each row of the nonvolatile memory array 200 of this embodiment is connected to one word line 255a, 255b, ..., 255j−1, 255j, 255j+1, ... 255m−1, 255m. The gates of the top select transistors 215a, 215b, ... 215n are connected to the top select gate line 250. The gates of the bottom select transistors 220a, 220b, ... 220n are connected to the bottom select gate line 260. All of the one word lines 255a, 255b, ... 255j−1, 255j, 255j+1, ... 255m−1, 255m, top select gate line 250, and the bottom select gate line 260 are connected to a word line controller 245. The word line controller 245 transfers word line operational voltages for selecting, programming, reading, and erasing the trapped charges representing the multiple digital data bits within the charge trapping region of each of the selected dual-sided charge-trapping nonvolatile memory cells 205.

Figure 3:
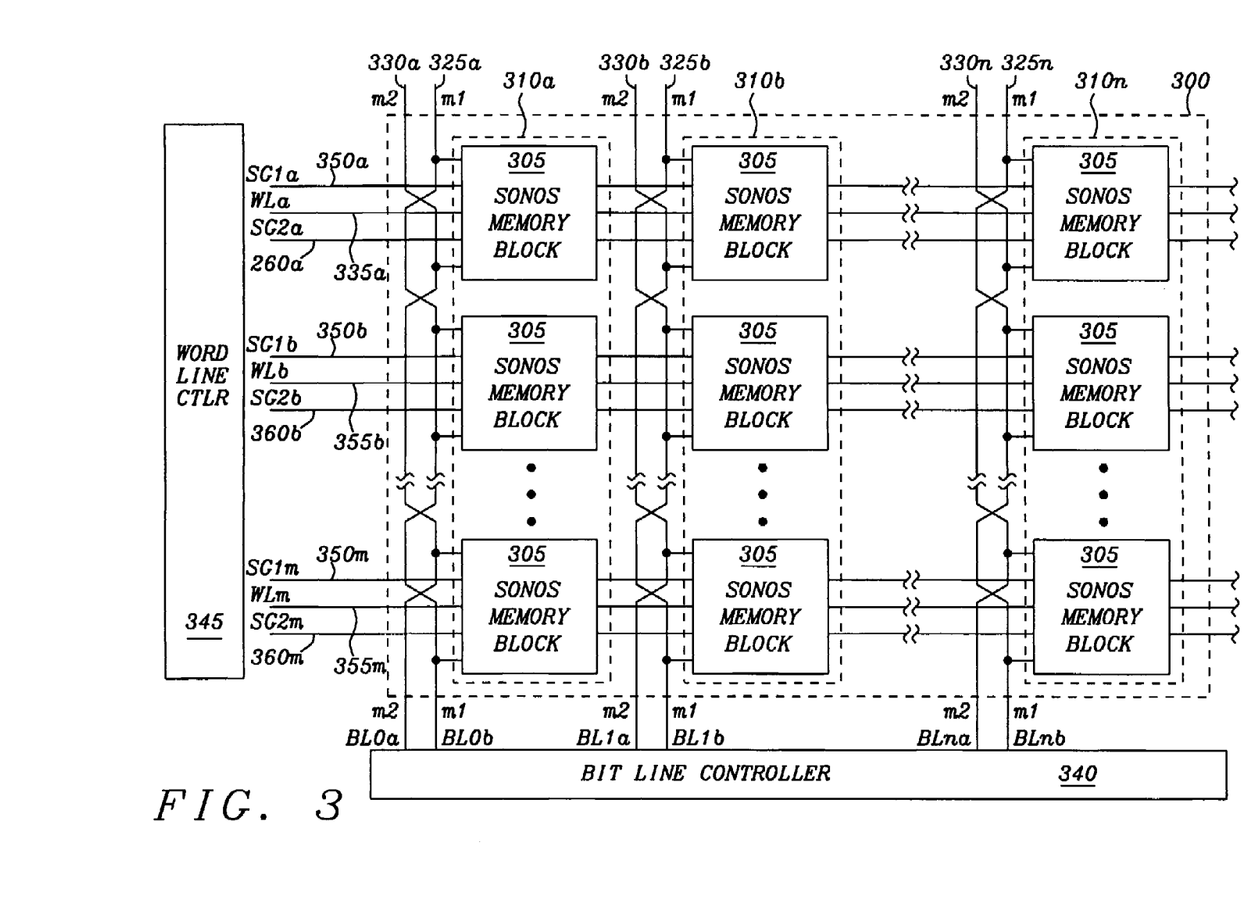
FIG. 3 is a schematic diagram of an embodiment of a general configuration of an array NAND series strings of dual-sided charge-trapping nonvolatile memory cells with a pair of associated braided bit lines of this invention.

A more generalized structure of an embodiment of the nonvolatile memory array 300 that is formed of dual-sided charge-trapping nonvolatile memory cells of FIG. 1a that are arranged in rows and columns is illustrated in FIG. 3. One of the NAND series string groupings 210a, 210b, ... 210n of the dual-sided charge-trapping nonvolatile memory cells 205, the top select transistor 215a, 215b, ... 215n connected to the one NAND series string grouping 210a, 210b, ... 210n, and the bottom select transistor 220a, 220b, ... 220n connected to the one NAND series string grouping 210a, 210b, ... 210n of FIG. 2 form a dual-sided charge-trapping nonvolatile memory block 305. In FIG. 3, each column 310a, 310b, ... 310n of the dual-sided charge-trapping nonvolatile memory blocks 305 is associated with a pair of braided bit lines 325a, 325b, ..., 325n and 330a, 330b, ..., 330n. The pairs of bit lines 325a, 325b, ..., 325n and 330a, 330b, ..., 330n are braided as described above in the embodiment of FIG. 2. This allows the contact structure to connect the second source/drain of each the top select transistors of each of the dual-sided charge-trapping nonvolatile memory NAND series string blocks 305 to the first level metal layer of each of the bit lines 325a, 325b, ..., 325n. Similarly, a contact structure connects the second source/drain of each the bottom select transistors of the dual-sided charge-trapping nonvolatile memory NAND series string blocks 305 to the first level metal layer of each of the second associated braided bit lines 330a, 330b, ..., 330n. At each of the dual-sided charge-trapping nonvolatile memory NAND series string blocks 305, a cross-over interlayer connection allows the first level metal layer of the first bit lines 325a, 325b, ..., 325n to be routed to the second metal layers and allows the first level metal layer of the second bit lines 330a, 330b, ..., 330n to be routed to the second metal layers. This routing of the pairs of braided bit lines 325a, 325b, ..., 325n and 330a, 330b, ..., 330n permits the placement of the pairs of braided bit lines 325a, 325b, ..., 325n and 330a, 330b, ..., 330n in channels between each of the column 310a, 310b, ... 310n of the dual-sided charge-trapping nonvolatile memory blocks 305. This routing of the bit lines 325a, 325b, ..., 325n and 330a, 330b, ..., 330n further creates a braided structure for the pairs of bit lines 325a, 325b, ..., 325n and 330a, 330b, ..., 330n.

All of the pairs of braided bit lines 325a, 325b, ..., 325n and 330a, 330b, ..., 330n are connected to the bit line controller 340. The bit line controller 340 provides the necessary bit line operational voltages to selected dual-sided charge-trapping nonvolatile memory cells of the dual-sided charge-trapping nonvolatile memory blocks 305 for programming, reading, and erasing trapped charges representing multiple digital data bits within a charge trapping region of each of the selected dual-sided charge-trapping nonvolatile memory cells.

A control gate of each of the dual-sided charge-trapping nonvolatile memory cells on each row of the dual-sided charge-trapping nonvolatile memory NAND series string blocks 305 of the nonvolatile memory array 300 of this embodiment is connected to one of the word lines 355a, 355b, ... 355m. The gates of the top select transistors are connected to the top select gate lines 350a, 350b, ... 350m. The gates of the bottom select transistors of the dual-sided charge-trapping nonvolatile memory NAND series string blocks 305 are connected to the bottom select gate lines 360a, 360b, ... 360m. All of the word lines 355a, 355b, ... 355m, top select gate lines 350a, 350b, ... 350m, and the bottom select gate lines 360a, 360b, ... 360m are connected to a word line controller 345. The word line controller 345 transfers word line operational voltages for selecting, programming, reading, and erasing the trapped charges representing the multiple digital data bits within the charge trapping region of each of the selected dual-sided charge-trapping nonvolatile memory cells of the nonvolatile memory array 300 of this embodiment.

Refer back now to FIG. 2 for a discussion of the control operation of the nonvolatile memory array 200 for programming, reading, and erasing trapped charges representing multiple digital data bits within the two charge trapping regions selected dual-sided charge-trapping nonvolatile memory cells 205. Each of the dual-sided charge-trapping nonvolatile memory cells 205 of the nonvolatile memory array 200 of this invention are essentially structured as shown in FIG. 1a. Multiple digital data bits are stored in the two separate charge trapping regions of the selected dual-sided charge-trapping nonvolatile memory cells 205.

To program a selected row of the dual-sided charge-trapping nonvolatile memory cells 205, the bit line bit line controller 240 is activated to provide the bit line program voltages ($V_{BLn}$) necessary for programming each of the charge trapping regions of the dual-sided charge-trapping nonvolatile memory cells 205 of the selected row. The word line controller 245 activates the top select gate line 250 and the bottom select gate line 260 to respectively turn on the top select transistors 215a, 215b, . . . 215n and bottom select transistors 220a, 220b, . . . 220n. The word line controller 245 is activated to provide the very large program voltage for generating a voltage field between a control gate of the selected dual-sided charge-trapping nonvolatile memory cells and a channel region of the selected dual-sided charge-trapping nonvolatile memory cell. The program state of the charge trapping regions of the selected dual-sided charge-trapping nonvolatile memory cells 205 being determined by the number of hot-carriers injected into each of the charge trapping regions.

As noted in Atwood, et al., "The charge storage ability of the flash memory cell is a key to the storage of multiple bits in a single cell. The flash cell is an analog storage device not a digital storage device. It stores charge (quantized at a single electron) not bits." The bit line controller 240 and the word line controller 245 places a precise amount of charge in the charge trapping regions such that in the nonvolatile memory array 200, the distribution of the charges as shown in FIG. 1c are sufficiently restricted that program states of each of the charge trapping regions are detectable. Assuming the ability to differentiate the differences in threshold voltage levels ($\Delta V_t$) for each binary digit of the programmed data, any number of bits conceptually may be programmed by the bit line controller 240 and the word line controller 245 to the charge trapping regions selected dual-sided charge-trapping nonvolatile memory cells 205.

To erase a selected row of the dual-sided charge-trapping nonvolatile memory cells 205, the bit line controller 240 connects the pairs of braided bit lines 225a, 225b, . . . , 225n and 230a, 230b, . . . , 230n to the ground reference voltage source 623. Any of the associated pair of braided bit lines 225a, 225b, . . . , 225n and 230a, 230b, . . . , 230n not being erased are connected to the bit line inhibit voltage to prevent the erasure of the charge trapping regions. To remove the hot carriers injected during the programming of the selected dual-sided charge-trapping nonvolatile memory cells 205, the word line erase circuit 540 is set to provide a word line erase voltage level to the dual-sided charge-trapping nonvolatile memory cells 205.

A read operation of the nonvolatile memory array 200 of this invention, is where the first charge trapping region is read in one direction and the second charge trapping region is read in the opposite direction. During each directional read operation, a word line read voltage source within the word line controller 250 is connected to the selected word lines 255a, 255b, . . . 255j−1, 255j, 255j+1, . . . 255m−1, 255m to provide a read voltage ($V_{READ}$). For reading the program state of the first charge trapping region, The word line controller 250 sets the selected word lines 255a, 255b, . . . 255j−1, 255j, 255j+1, . . . 255m−1, 255m to the read voltage level ($V_{READ}$). The bit line controller 240 sets the first of the associated pair of braided bit lines associated pair of braided bit lines 225a, 225b, . . . , 225n to the ground reference voltage level (0V) and the second associated pair of braided bit lines 230a, 230b, . . . , 230n the drain read voltage ($V_{DRAIN}$). The word line controller 245 activates the top select gate line 250 and the bottom select gate line 260 to respectively turn on the top select transistors 215a, 215b, . . . 215n and bottom select transistors 220a, 220b, . . . 220n to connect the pairs of braided bit lines 225a, 225b, . . . , 225n and 230a, 230b, . . . , 230n respectively to the top select transistors 215a, 215b, . . . 215n and the bottom select transistors 220a, 220b, . . . 220n. As noted above, the read voltage level ($V_{READ}$) must be varied incrementally through each of the threshold boundary voltage levels (VPVn) as shown in FIG. 1c to determine the program state of the first charge trapping regions. For reading the program state of the second charge trapping regions, the word line controller 250 is set to the read voltage level ($V_{READ}$). The bit line controller 240 sets the first of the associated pair of braided bit lines 225a, 225b, . . . , 225n and 230a, 230b, . . . , 230n to the drain read voltage ($V_{DRAIN}$) and the second of the associated pair of braided bit lines 225a, 225b, . . . , 225n and 230a, 230b, . . . , 230n to the ground reference voltage level (0V). Again, the word line controller 245 activates the top select gate line 250 and the bottom select gate line 260 to respectively turn on the top select transistors 215a, 215b, . . . 215n and bottom select transistors 220a, 220b, . . . 220n to connect the pairs of braided bit lines 325a, 325b, . . . , 325n and 330a, 330b, . . . , 330n respectively to the top select transistors 215a, 215b, . . . 215n and the bottom select transistors 220a, 220b, . . . 220n. Again, as noted above, the read voltage level ($V_{READ}$) must be varied incrementally through each of the threshold boundary voltage levels (VPVn) as shown in FIG. 1c to determine the program state of the second charge trapping region of the selected row of the dual-sided charge-trapping nonvolatile memory cells 205.

During the read operation, a sense amplifier within the bit line controller 240 determines whether the selected dual-sided charge-trapping nonvolatile memory cells 205 are conducting or not in each direction. Based on the threshold boundary voltage level (VPVn) and the conduction of the selected dual-sided charge-trapping nonvolatile memory cells 205, the sense amplifier determines the binary digital data programmed in each of the charge trapping regions and transfers the binary digital data to external circuitry through a data input/output bus.

Refer now to FIGS. 4a-c and 5a-b for an overview of the construction of an embodiment of the nonvolatile memory array of dual-sided charge-trapping nonvolatile memory cells with braided bit lines. Multiple dual-sided charge-trapping nonvolatile memory cells are formed (Box 500) and arranged (Box 505) into rows and columns on an integrated circuit substrate 400. Groups of the dual-sided charge-trapping nonvolatile memory cells on each column of the nonvolatile memory array dual-sided charge-trapping nonvolatile memory cells are formed (Box 510) into NAND series strings of the dual-sided charge-trapping nonvolatile memory cells 410a, 410b, . . . , 410d. A first source/drain 415a, 415b, . . . , 415d of each of the top select transistors is connected (Box 515) to a top dual-sided charge-trapping nonvolatile memory cell of each of the NAND series strings of the dual-sided charge-trapping nonvolatile memory cells 410a, 410b, . . . , 410d. Similarly, a first source/drain 420a, 420b, . . . , 420d of each of the bottom select transistors is connected (Box 515) to the dual-sided charge-trapping nonvolatile memory cell of each of the NAND series strings of the dual-sided charge-trapping nonvolatile memory cells 410a, 410b, . . . , 410d. Two first level conductor paths 425a, 425b, . . . , 425d and 430a, 430b, . . . , 430d are formed (Box 520) above each of the NAND series strings 410a, 410b, . . . , 410d on each column of dual-sided charge-trapping nonvolatile memory cells. A first of the first level conductor paths has a contact 440a, 440b, . . . , 440d formed (Box 525) to a second source/drain region 435a, 435b, . . . , 435d of the top select transistor of each of the NAND series strings 410a, 410b, . . . , 410d on each column of dual-sided charge-trapping nonvolatile memory cells. A second of the first level conductor paths has a contact 450a, 450b, . . . , 450d formed (Box 530) to a second source/drain region 445a, 445b, . . . , 445d of the bottom select transistor of each of the NAND series strings 410a, 410b, . . . , 410d on each column of dual-sided charge-trapping nonvolatile memory cells.

Two second level conductor paths 455a, 455b, . . . , 455d and 460a, 460b, . . . , 460d are formed (Box 535) adjacent each of the NAND series strings 410a, 410b, . . . , 410d on each column of dual-sided charge-trapping nonvolatile memory cells to form an associated pair of braided bit lines for each column of dual-sided charge-trapping nonvolatile memory cells. A first of the two first level conductor paths 425a, 425b, . . . , 425d is connected (Box 540) through interlayer vias 465a, 465b, . . . , 465d to a first of the second level conductor paths 455a, 455b, . . . , 455d adjacent to each of the NAND series strings 410a, 410b, . . . , 410d of each column of dual-sided charge-trapping nonvolatile memory cells. A second of the two first level conductor 430a, 430b, . . . , 430d is connected (Box 545) through the interlayer vias 470a, 470b, . . . , 470d to a second of the second level conductor paths 460a, 460b, . . . , 460d adjacent to each of the NAND series strings 410a, 410b, . . . , 410d of each column of dual-sided charge-trapping nonvolatile memory cells.

Figure 4A:
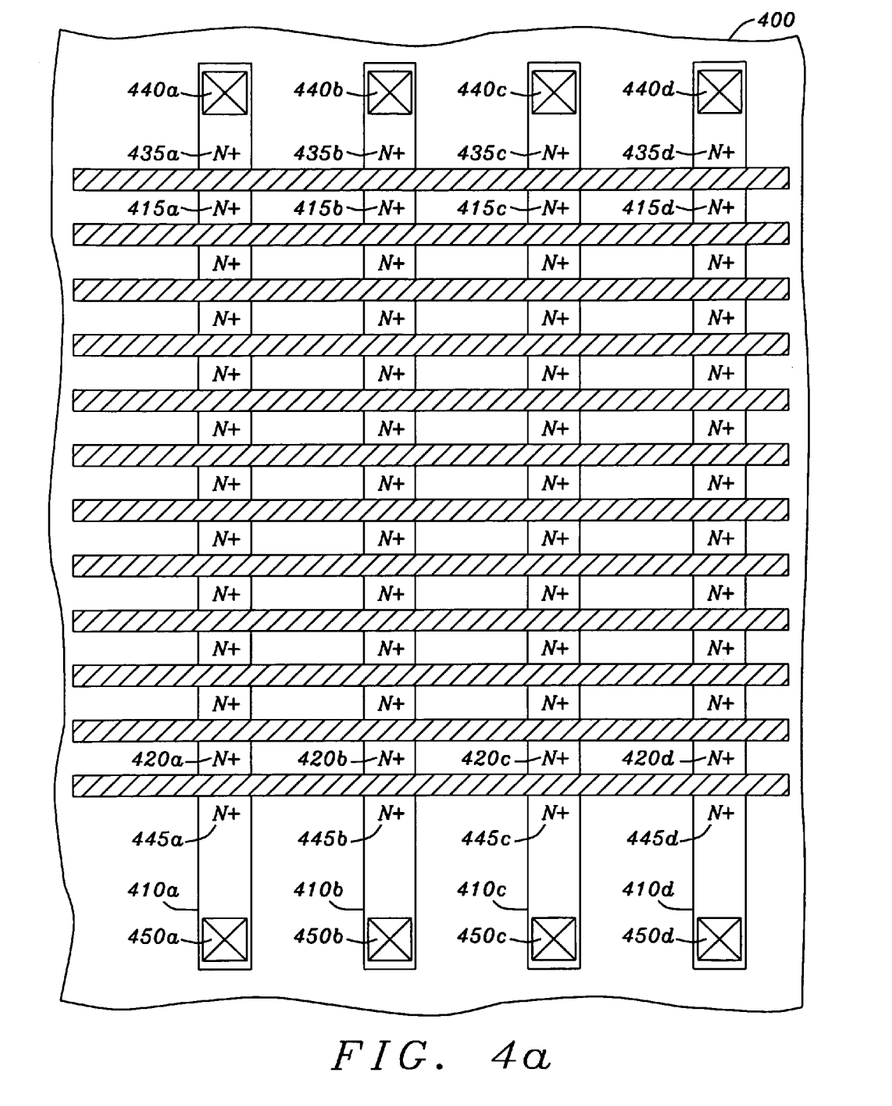
FIG. 4a is a top view of the second embodiment of an array of NAND series strings of dual-sided charge-trapping nonvolatile memory cells with pairs of associated braided bit lines of this invention.
Figure 4B:
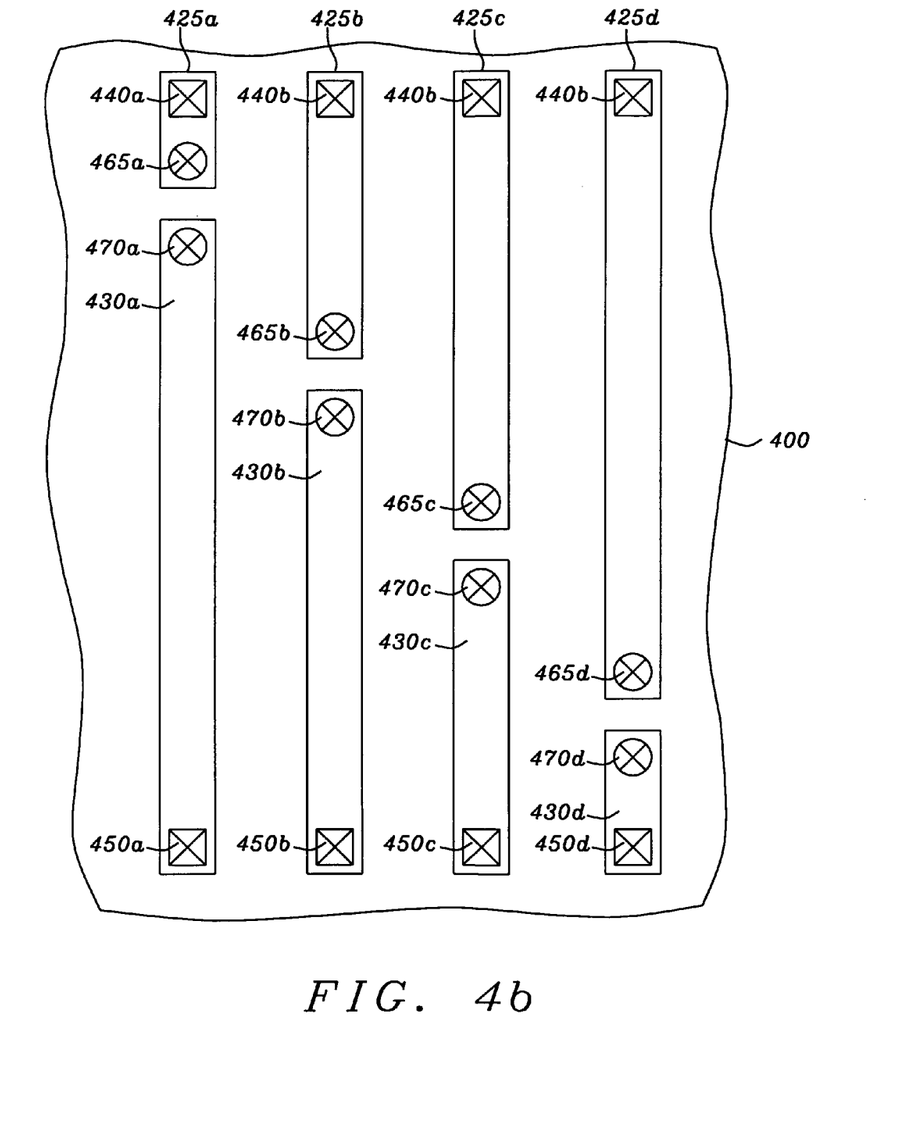
Figure 4C:
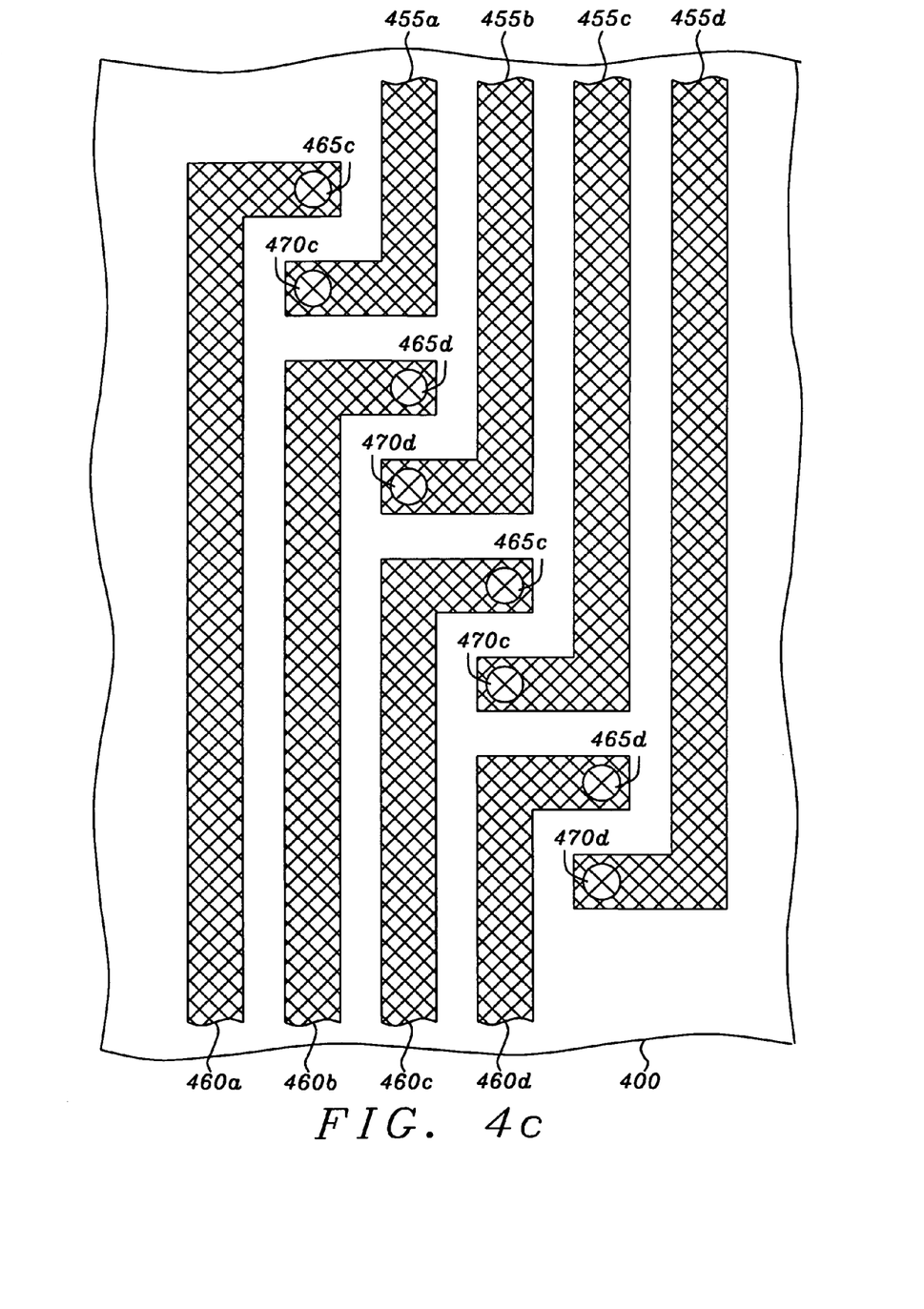
Figure 5A:
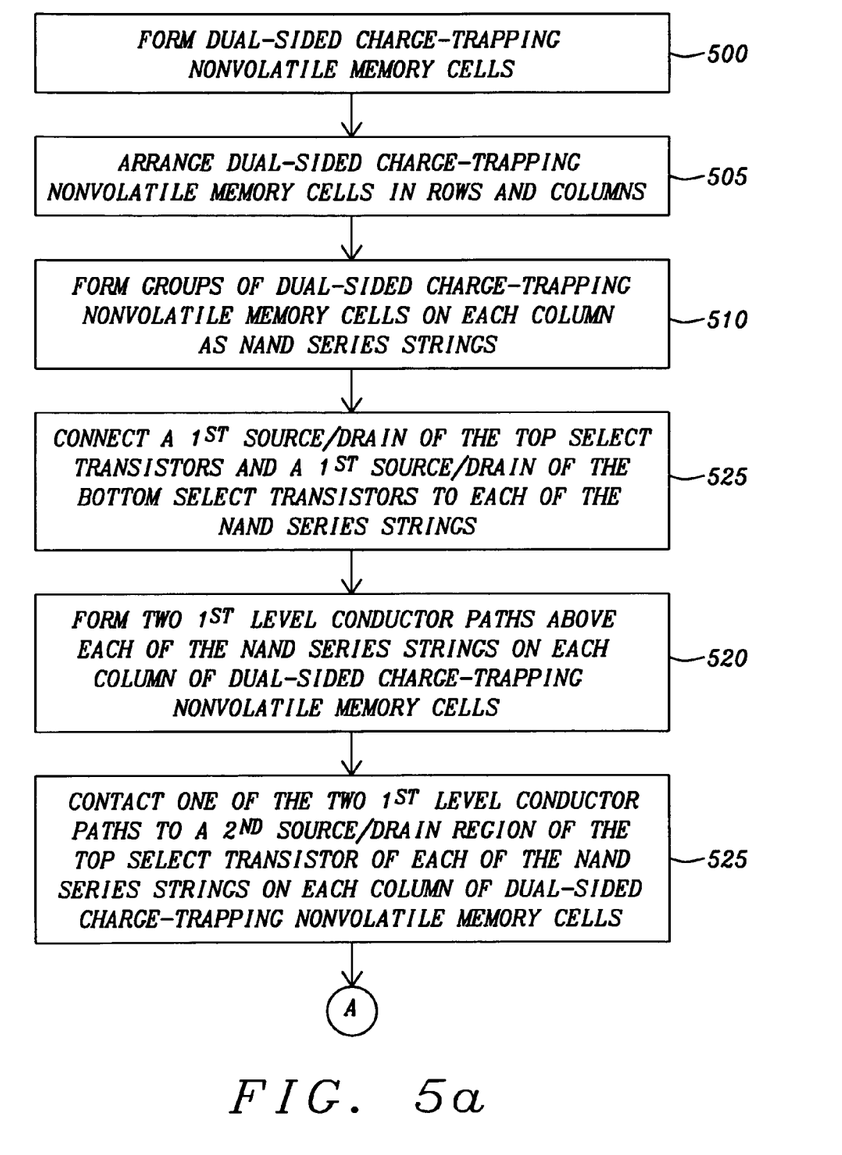
FIGS. 5a and 5b are process diagrams for the formation of an array of an is NAND series strings of dual-sided charge-trapping nonvolatile memory cells with pairs of associated braided bit lines of this invention.
Figure 5B:
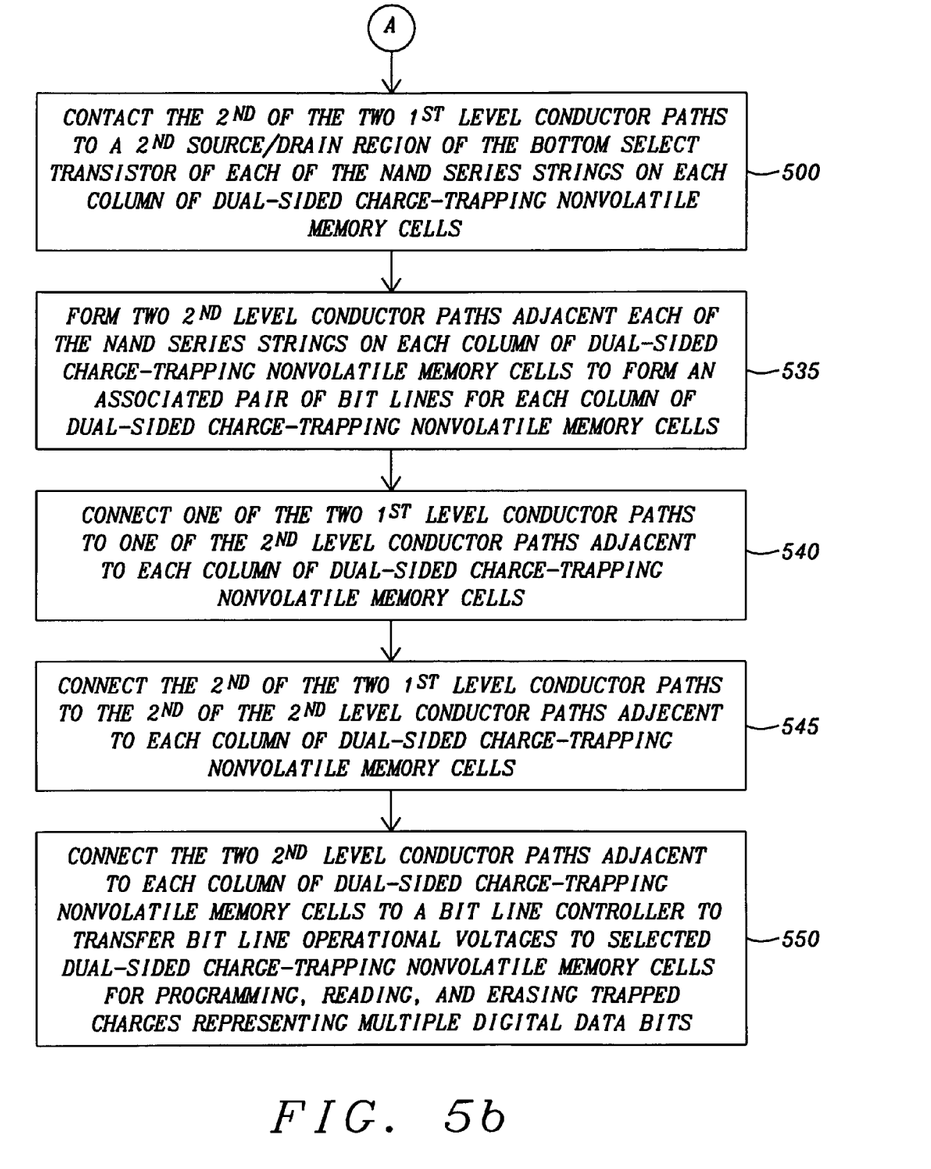

The first of the two first level conductor paths 425a, 425b, . . . , 425d and the first of the second level conductor paths 455a, 455b, . . . , 455d as connected by the interlayer vias 465a, 465b, . . . , 465d form the first associated bit line connected to the top select transistor of each of the NAND series strings 410a, 410b, . . . , 410d of each column of dual-sided charge-trapping nonvolatile memory cells. The second of the two first level conductor paths 430a, 430b, . . . , 430d and second of the second level conductor paths 460a, 460b, . . . , 460d as connected by the interlayer vias 470a, 470b, . . . , 470d for the second of the associated braided bit lines connected to the bottom select transistor of each of the NAND series strings 410a, 410b, . . . , 410d of each column of dual-sided charge-trapping nonvolatile memory cells. These two bit lines, as constructed create the braided structure for the bit lines as described above.

The two second level conductors paths 455a, 455b, . . . , 455d and 460a, 460b, . . . , 460d adjacent to each NAND series strings 410a, 410b, . . . , 410d of each column of dual-sided charge-trapping nonvolatile memory cells is connected (Box 550) to a bit line controller to transfer bit line operational voltages to selected dual-sided charge-trapping nonvolatile memory cells of the NAND series strings 410a, 410b, . . . , 410d of each column of dual-sided charge-trapping nonvolatile memory cells for programming, reading, and erasing trapped charges representing multiple digital data bits.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory array of dual-sided charge-trapping nonvolatile memory cells arranged in rows and columns wherein the dual-sided charge-trapping nonvolatile memory cells on each column form at least one grouping of dual-sided charge-trapping nonvolatile memory cells that is arranged in a NAND series string of dual-sided charge-trapping nonvolatile memory cells, each NAND series string having a top select transistor and a bottom select transistor connected to the NAND series string, the nonvolatile memory array comprising:

a plurality of braided bit lines connected such that each column of the dual-sided charge-trapping nonvolatile memory cells is associated with one pair of braided bit lines, such that a source/drain of the top select transistor is connected through a first conductive segment to a first bit line of the pair of braided bit lines and a source/drain of the bottom select transistor is connected to a second bit line of the pair of braided bit lines.

2. The nonvolatile memory array of claim 1 wherein the pair of braided bit lines associated with each column of dual-sided charge-trapping nonvolatile memory cells is connected within the array to allow the first bit line to be connect to the top select transistor and the second bit line to be connect to the bottom select transistor.

3. The nonvolatile memory array of claim 1 wherein the first and second conductive segments are placed on a first level conductive layer disposed on an isolating layer superiorly to the dual-sided charge-trapping nonvolatile memory cells of the NAND string having the top select transistor and the bottom select transistor connected to the first and second conductive segments.

4. The nonvolatile memory array of claim 1 wherein the first bit line of the pair of associated braided bit lines is connected to the first conductive segment and is placed in a wiring channel at a first side of the each column of the dual-sided charge-trapping nonvolatile memory cells and the second bit line of the pair of associated braided bit lines is connected to the second conductive segment and is placed in a wiring channel at a second side of the each column of the dual-sided charge-trapping nonvolatile memory cells.

5. The nonvolatile memory array of claim 1 further comprising:

a plurality of word lines, each word line associated with one row of the plurality of dual-sided charge-trapping nonvolatile memory cells;

a top select line connected to a gate of the top select transistor of each column of the dual-sided charge-trapping nonvolatile memory cells;

a bottom select line connected to a gate of the bottom select transistor of each column of the dual-sided charge-trapping nonvolatile memory cells; and a word line controller connected to the word lines, the top select line, and the bottom select line to transfer word line operational voltages for selecting, programming, reading, and erasing the trapped charges representing the multiple digital data bits within the charge trapping region of each of the selected dual-sided charge-trapping dual-sided charge-trapping nonvolatile memory cells.

6. The nonvolatile memory array of claim 1 further comprising:

a bit line controller connected to each pair of the plurality of braided bit lines to transfer bit line operational voltages to selected dual-sided charge-trapping nonvolatile memory cells of the NAND series string of dual-sided charge-trapping nonvolatile memory cells for programming, reading, and erasing trapped charges representing digital data bits within a charge trapping region of each of the selected dual-sided charge-trapping nonvolatile memory cells.

7. The nonvolatile memory array of claim 1 wherein the dual-sided charge-trapping nonvolatile memory cells are single poly-silicon SONOS nonvolatile memory cells, MONOS nonvolatile memory cells, or split-gate nonvolatile memory cells.

8. A nonvolatile memory integrated circuit comprising:
a plurality of dual-sided charge-trapping nonvolatile memory cells arranged in rows and columns wherein the dual-sided charge-trapping nonvolatile memory cells on each column form at least one grouping of dual-sided charge-trapping nonvolatile memory cells that is arranged in a NAND series string of dual-sided charge-trapping nonvolatile memory cells, each NAND series string having a top select transistor and a bottom select transistor connected to the NAND series string;
a plurality of braided bit lines connected such that each column of the dual-sided charge-trapping nonvolatile memory cells is associated with one pair of braided bit lines, such that a source/drain of the top select transistor is connected through a first conductive segment to a first bit line of the pair of braided bit lines and a source/drain of the bottom select transistor is connected to a second bit line of the pair of braided bit lines;
a bit line controller connected to each pair of the plurality of braided bit lines to transfer bit line operational voltages to selected dual-sided charge-trapping nonvolatile memory cells of the NAND series string of dual-sided charge-trapping nonvolatile memory cells for programming, reading, and erasing trapped charges representing digital data bits within a charge trapping region of each of the selected dual-sided charge-trapping nonvolatile memory cells;
a plurality of word lines, each word line associated with one row of the plurality of dual-sided charge-trapping nonvolatile memory cells;
a top select line connected to a gate of the top select transistor of each column of the dual-sided charge-trapping nonvolatile memory cells;
a bottom select line connected to a gate of the bottom select transistor of each column of the dual-sided charge-trapping nonvolatile memory cells; and
a word line controller connected to the word lines, the top select line, and the bottom select line to transfer word line operational voltages for selecting, programming, reading, and erasing the trapped charges representing the multiple digital data bits within the charge trapping region of each of the selected dual-sided charge-trapping dual-sided charge-trapping nonvolatile memory cells.

9. The nonvolatile memory array of claim 8 wherein the pair of braided bit lines associated with each column of dual-sided charge-trapping nonvolatile memory cells is connected within the array to allow the first bit line to connect to the top select transistor and the second bit line to connect to the bottom select transistor.

10. The nonvolatile memory array of claim 8 wherein the first and second conductive segments are placed on a first level conductive layer disposed on an isolating layer superiorly to the dual-sided charge-trapping nonvolatile memory cells of the NAND string having the top select transistor and the bottom select transistor connected to the first and second conductive segments.

11. The nonvolatile memory array of claim 8 wherein the first bit line of the pair of associated braided bit lines is connected to the first conductive segment and is placed in a wiring channel at a first side of the each column of the dual-sided charge-trapping nonvolatile memory cells and the second bit line of the pair of associated braided bit lines is connected to the second conductive segment and is placed in a wiring channel at a second side of the each column of the dual-sided charge-trapping nonvolatile memory cells.

12. The nonvolatile memory array of claim 8 wherein the dual-sided charge-trapping nonvolatile memory cells are single poly-silicon SONOS nonvolatile memory cells, MONOS nonvolatile memory cells, or split-gate nonvolatile memory cells.

13. A method for forming a nonvolatile memory array comprising the steps of:
forming a plurality of dual-sided charge-trapping nonvolatile memory cells;
arranging the plurality of dual-sided charge-trapping nonvolatile memory cells in rows and columns
arranging the dual-sided charge-trapping nonvolatile memory cells on each column into at least one grouping of dual-sided charge-trapping nonvolatile memory cells;
connecting each of a plurality of NAND series strings of dual-sided charge-trapping nonvolatile memory cells to a top select transistor and a bottom select transistor;
forming a plurality of braided bit lines parallel to each column of NAND series string of dual-sided charge-trapping nonvolatile memory cells;
associating each column of the dual-sided charge-trapping nonvolatile memory cells with a pair of braided bit lines;
connecting a source/drain of the top select transistor through a first conductive segment to a first bit line of the pair of braided bit lines
connecting a source/drain of the bottom select transistor through a second conductive segment to a second bit line of the pair of braided bit lines; and
connecting a bit line controller to the plurality of braided bit lines to transfer bit line operational voltages to selected dual-sided charge-trapping nonvolatile memory cells for programming, reading, and erasing trapped charges representing multiple digital data bits within a charge trapping region of each of the selected dual-sided charge-trapping nonvolatile memory cells.

14. The method for forming the nonvolatile memory array of claim 13 further comprising the steps of:
providing a plurality of word lines;
connecting each word line with one row of the plurality of dual-sided charge-trapping nonvolatile memory cells;
providing at least one top select lines;
connecting each top select line to a gate of the top select transistor of at least one of the NAND series strings of dual-sided charge-trapping nonvolatile memory cells such that when the top select transistor is activated, the NAND series string of dual-sided charge-trapping nonvolatile memory cells associated with the associated first bit line are connected to the first bit line;
providing at least one bottom select line;
connecting the bottom select line to a gate of the bottom select transistor of at least one of the NAND series strings of dual-sided charge-trapping nonvolatile memory cells such that when the bottom select transistor is activated, the NAND series string of dual-sided charge-trapping nonvolatile memory cells associated with the associated second bit line are connected to the second bit line; and
connecting a word line controller to the word lines, the top select lines, and the bottom select lines to transfer word line operational voltages for selecting, programming, reading, and erasing the trapped charges representing the multiple digital data bits within the charge trapping region of each of the selected dual-sided charge-trapping nonvolatile memory cells.

15. The method for forming the nonvolatile memory array of claim 13 further comprising the steps of connecting the pair of braided bit lines associated with each column of dual-sided charge-trapping nonvolatile memory cells within the array to allow the first bit line to connect to the top select transistor and the second bit line to connect to the bottom select transistor.

16. The method for forming the nonvolatile memory array of claim 13 wherein connecting a source/drain of the top select transistor comprises the step of placing the first conductive segment on a first level conductive layer disposed on an isolating layer superiorly to the dual-sided charge-trapping nonvolatile memory cells of the NAND string having the top select transistor connected to the first conductive segment.

17. The method for forming the nonvolatile memory array of claim 13 wherein connecting a source/drain of the bottom select transistor second comprises placing the second conductive segment the first level conductive layer disposed on the isolating layer superiorly to the dual-sided charge-trapping nonvolatile memory cells of the NAND string having the bottom select transistor connected to the second conductive segment.

18. The method for forming the nonvolatile memory array of claim 13 wherein connecting a source/drain of the top select transistor comprises the step of placing the first bit line of the pair of associated braided bit lines connected to the first conductive segment in a wiring channel at a first side of the each column of the dual-sided charge-trapping nonvolatile memory cells.

19. The method for forming the nonvolatile memory array of claim 13 wherein connecting a source/drain of the bottom select transistor comprises the step of placing the second bit line of the pair of associated braided bit lines to the second conductive segment in a wiring channel at a second side of the each column of the dual-sided charge-trapping nonvolatile memory cells.

20. The method for forming the nonvolatile memory array of claim 13 wherein the dual-sided charge-trapping nonvolatile memory cells are single poly-silicon SONOS nonvolatile memory cells, MONOS nonvolatile memory cells, or split-gate nonvolatile memory cells.

* * * * *